United States Patent
Sakai et al.

(10) Patent No.: US 8,757,826 B2
(45) Date of Patent: Jun. 24, 2014

(54) LIGHT-EMITTING DEVICE, METHOD FOR PRODUCING THE SAME, AND ILLUMINATING DEVICE

(75) Inventors: Takaaki Sakai, Tokyo (JP); Hiroshi Kotani, Tokyo (JP); Takahiko Nozaki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 93 days.

(21) Appl. No.: 13/356,637

(22) Filed: Jan. 23, 2012

(65) Prior Publication Data
US 2012/0188772 A1  Jul. 26, 2012

(30) Foreign Application Priority Data

Jan. 21, 2011 (JP) .................................. 2011-011306
Mar. 22, 2011 (JP) .................................. 2011-063002

(51) Int. Cl.
*F21V 9/16* (2006.01)
*F21V 7/00* (2006.01)

(52) U.S. Cl.
USPC .......................... 362/84; 362/231; 362/249.02

(58) Field of Classification Search
USPC ................. 362/84, 231, 249.02; 257/98, 100; 445/58; 313/498
See application file for complete search history.

(56) References Cited

U.S. PATENT DOCUMENTS

| | | | | |
|---|---|---|---|---|
| 7,521,728 B2 * | 4/2009 | Andrews | ........................ | 257/100 |
| 7,556,404 B2 * | 7/2009 | Nawashiro et al. | ........... | 362/293 |
| 7,932,529 B2 * | 4/2011 | Lin et al. | ........................ | 257/98 |
| 8,368,099 B2 * | 2/2013 | Lu et al. | ........................ | 257/98 |
| 8,419,497 B2 * | 4/2013 | Takasu et al. | ................... | 445/58 |
| 2006/0092644 A1 * | 5/2006 | Mok et al. | ..................... | 362/327 |
| 2006/0105485 A1 | 5/2006 | Basin et al. | | |
| 2008/0194061 A1 | 8/2008 | Medendorp | | |

FOREIGN PATENT DOCUMENTS

| | | |
|---|---|---|
| JP | 2006-148147 A | 6/2006 |
| JP | 2008-211205 A | 9/2008 |
| JP | 2010-125647 A | 6/2010 |

* cited by examiner

*Primary Examiner* — Peggy A. Neils
(74) *Attorney, Agent, or Firm* — Kenealy Vaidya LLP

(57) ABSTRACT

A light-emitting device having an LED element and a resin layer including a convex portion covering the LED element can suppress color unevenness to achieve light emission with uniform color distribution. The light-emitting device can include a substrate, an LED element mounted on the substrate, a resin layer which contains a wavelength conversion material and is formed on the substrate to cover the LED element, the resin layer including a convex portion directly covering the LED element and a flat thin film portion extending around the convex portion, and a reflective portion which is formed over the thin film portion around the convex portion. A diffusion portion can be formed to cover the convex portion of the resin layer.

10 Claims, 18 Drawing Sheets

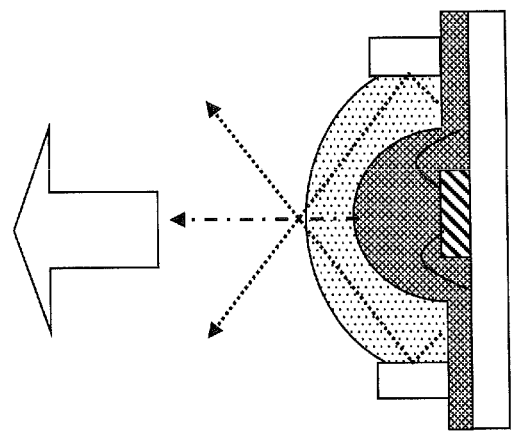
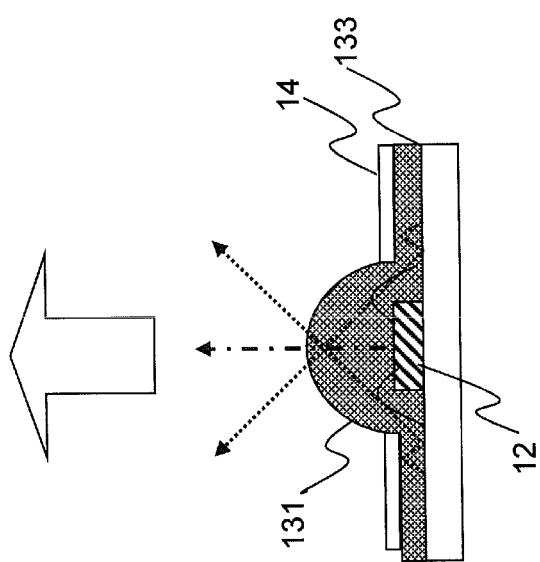
Fig. 4A
Fig. 4B

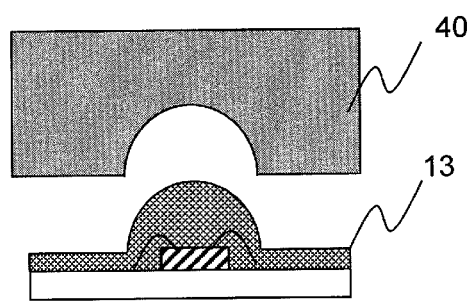
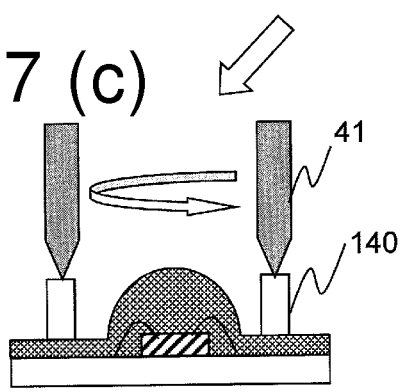
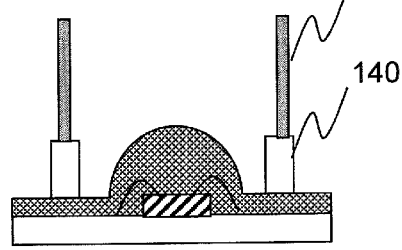
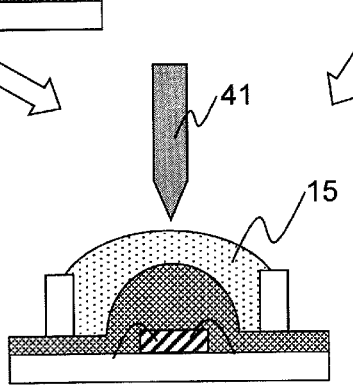
Fig. 7 (a)
Fig. 7 (b)
Fig. 7 (c)
Fig. 7 (d)
Fig. 7 (e)

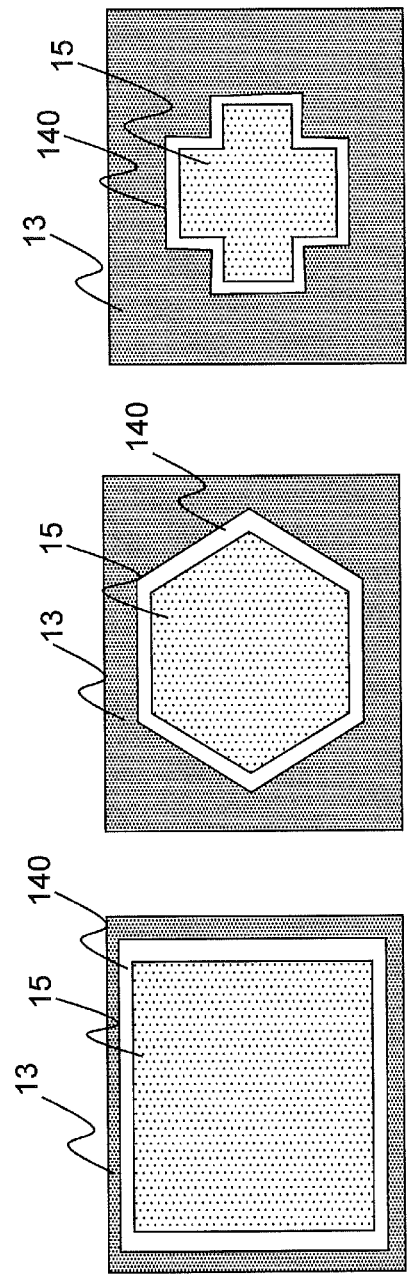

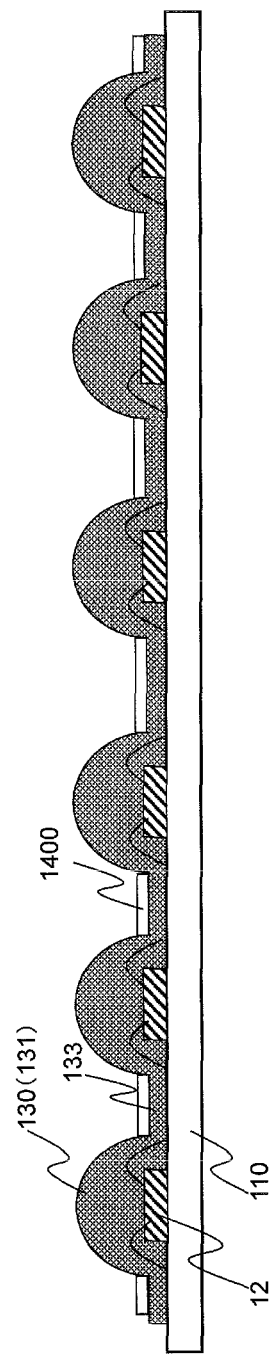
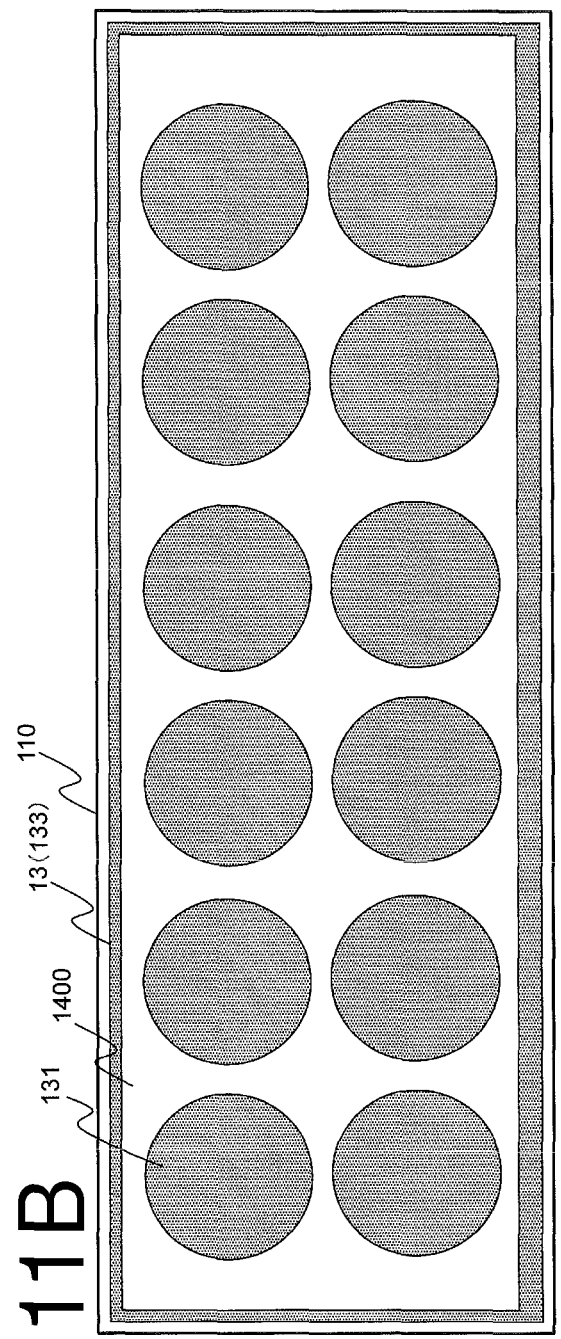
Fig. 11A
Fig. 11B

Example 1

Example 2

Comparative Example 1

Comparative Example 2

Comparative Example 3

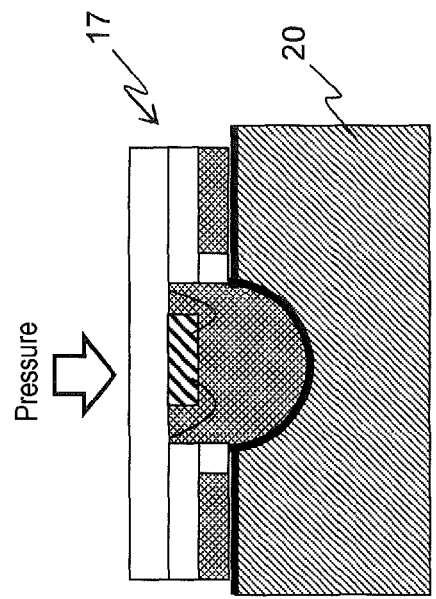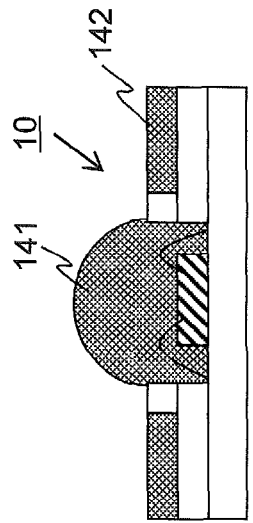
Fig. 17A
Fig. 17D
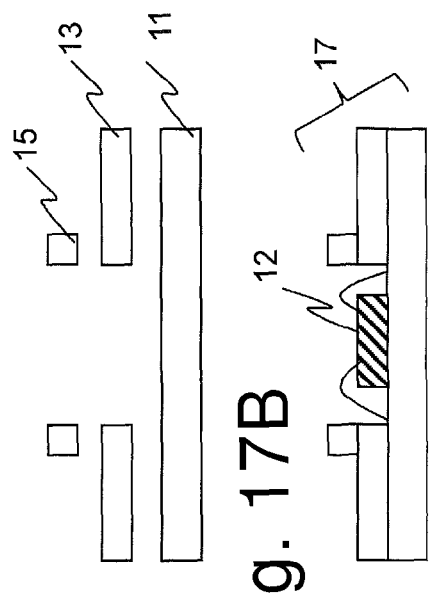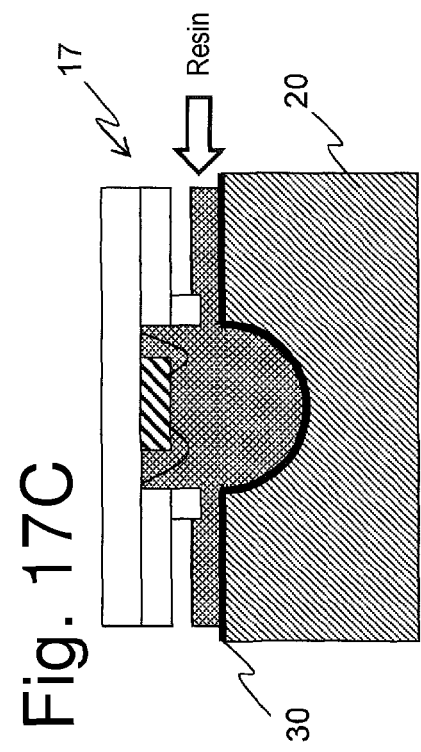
Fig. 17B
Fig. 17E
Fig. 17C Fig. 20A
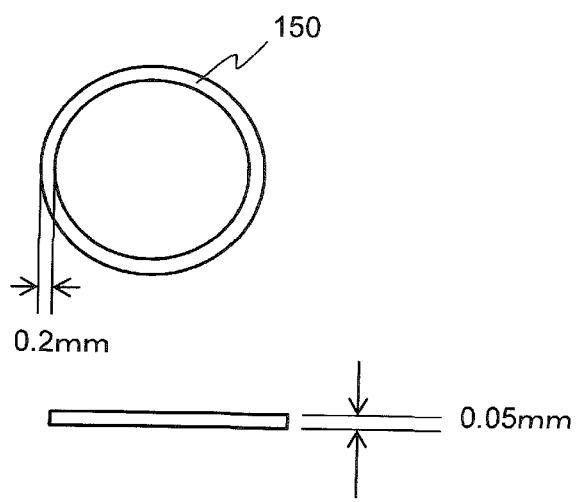
Fig. 20B
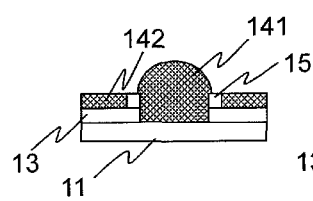 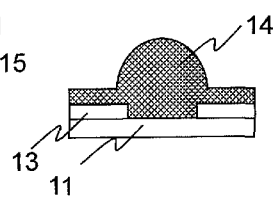 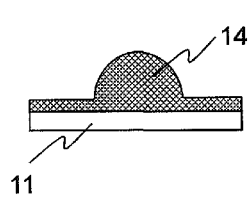 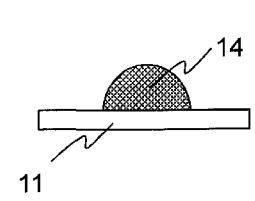
Fig. 21A  Fig. 21B  Fig. 21C  Fig. 21D

LIGHT-EMITTING DEVICE, METHOD FOR PRODUCING THE SAME, AND ILLUMINATING DEVICE

This application claims the priority benefit under 35 U.S.C. §119 of Japanese Patent Application Nos. 2011-011306 filed on Jan. 21, 2011 and 2011-063002 filed on Mar. 22, 2011, which are hereby incorporated in their entirety by reference.

TECHNICAL FIELD

The presently disclosed subject matter relates to a light-emitting device utilizing an LED element, a method for producing the same and an illuminating device. In particular, the presently disclosed subject matter relates to a light-emitting device including an LED element and a resin layer formed using a compression molding method and sealing the LED element to improve the color evenness.

BACKGROUND ART

Many light-emitting devices utilizing an LED element include a combination of an LED element and a wavelength conversion material such as a fluorescent material in order to provide light emission with desired color such as white light emission. In general, such a wavelength conversion material can be dispersed in a sealing resin for the LED element to cover the LED element therewith. In a conventional production method, a substrate on which an LED element is mounted is provided with a recessed portion (horn), on the bottom of which the LED element is mounted. Then, a fluorescent material-containing resin is filled in the recessed portion to complete a light-emitting device.

In this light-emitting device, however, the optical path length from the LED element to the top surface of a portion of the resin layer immediately above the LED element may be different from the optical path length from the LED element to the peripheral side surface of the resin layer, resulting in color unevenness at those regions. For example, suppose a light-emitting device utilizing a combination of a blue LED element and a fluorescent material, bluish light can be observed at the area of the resin layer immediately above the LED element while yellowish light can be observed at the peripheral area of the resin layer due to the color of the light emitted from the fluorescent material.

To cope with this problem, methods for providing a hemispherical fluorescent material layer over an LED element by injecting a fluorescent material containing resin in between a mold and the LED element and curing the resin. (See, for example, Japanese Patent Application Laid-Open Nos. 2006-148147, 2008-211205, and 2010-125647.) In these methods, a compression molding method has been widely utilized as the resin molding method. Such a hemispherical fluorescent material layer can alleviate the color unevenness due to the difference in optical path lengths within the fluorescent material layer, but the effects are insufficient.

Further, in order to remove bubbles contained in the fluorescent material resin, the compression molding method may require inserting a thin releasing sheet in between a mold and a substrate on which an LED element has been mounted and perform vacuuming. As a result, the fluorescent material resin can enter the space between the substrate and the sheet, so that a thin resin layer can be formed on the surface of the substrate where the LED element has been mounted.

Accordingly, the light-emitting device produced by means of the compression molding method, in addition to the hemispherical resin layer (sometimes referred to as a hemispherical fluorescent material layer), a thin resin layer formed around the hemispherical resin layer can be formed to emit light by the excitation of the fluorescent material by the light from the LED element. Therefore, the surrounding area can be observed as being more yellowish than the hemispherical portion, resulting in color unevenness more. A light source utilizing an LED element is often used for an illuminating device or the like in combination with condensing optical components such as a lens. When light emitted from such a light source with color unevenness is projected by condensing optical components or the like, the color unevenness or color separation is made more explicit, thereby providing mostly or only uneven illumination. FIGS. 1A and 1B are a cross-sectional view of a white LED light-emitting device (light source) produced by a compression molding method, and a schematic diagram illustrating how the color separation of the projected light occurs. As shown in the drawings (in particular, see FIG. 1B), the area immediately above the LED element can be observed to be a rectangular bluish area corresponding to the shape of the element, the area surrounding the bluish area can be observed to be a white light area, and the area around the hemispherical resin layer can be observed to be a yellowish area.

To cope with this problem, after molding the resin layer, the thin resin layer around the hemispherical resin layer can be removed by sandblasting or peeled off by tape masking. However, when the thin resin layer is removed by sandblasting, the hemispherical resin layer may also be damaged at the same time. When the thin resin layer is peeled off by tape masking, the hemispherical resin layer may also be peeled off partially at the same time, resulting in decreased production yield of the light-emitting device.

SUMMARY

The presently disclosed subject matter was devised in view of these and other problems and features and in association with the conventional art. According to an aspect of the presently disclosed subject matter, a light-emitting device can solve the problem in which the color unevenness occurs without deterioration of the production yield while achieving the generation of desired colored light with uniform distribution.

According to another aspect of the presently disclosed subject matter, a light-emitting device can intentionally utilize the light emission from a thin film portion of a resin layer around a convex portion of the resin layer so as to mix the light from the thin film portion with the light upwardly emitted by the LED element, thereby achieving the uniform light emission.

According to still another aspect of the presently disclosed subject matter, a light-emitting device can include: a substrate; an LED element mounted on the substrate; a resin layer which contains a wavelength conversion material and is formed on the substrate to cover the LED element, the resin layer including a convex portion directly covering the LED element and a flat thin film portion extending around the convex portion; and a reflective portion which is formed over the thin film portion around the convex portion.

According to still another aspect of the presently disclosed subject matter, a light-emitting device can include: a substrate; a plurality of LED elements mounted on the substrate in an array; a resin layer which contains a wavelength conversion material and is formed on the substrate to cover the plurality of LED elements; and a reflective portion which is formed over an area of the resin layer between the plurality of LED elements.

According to further another aspect of the presently disclosed subject matter, a method for producing a light-emitting device can include: mounting at least one LED element on a substrate; forming a resin layer including a convex portion covering the LED element by a compression molding method; and forming a reflective portion around the convex portion of the resin layer.

According to still further another aspect of the presently disclosed subject matter, a method for producing a light-emitting device can include: mounting at least one LED element on a substrate; forming a resin layer including a convex portion covering the LED element by a compression molding method; forming a diffusion portion covering the resin layer by using a resin containing a diffusion material; and forming a reflective portion around the convex portion of the resin layer.

According to still further another aspect of the presently disclosed subject matter, a method for producing a light-emitting device can include providing a light-shielding projection portion separating a convex portion of a resin layer covering the LED element (hemispherical resin layer) and a thin film portion of the resin layer inevitably formed therearound during the compression molding, thereby preventing the light from the LED element from entering the thin film portion of the resin layer from the convex portion thereof. The projection portion can function as part of reflector in the completed light-emitting device so that the light emitted from the convex portion of the resin layer can be even.

According to further another aspect of the presently disclosed subject matter, a method for producing a light-emitting device can include injecting a resin between a mold and a substrate where an LED element has been mounted while performing vacuuming so that a resin layer sealing the LED element is formed. The method can include mounting an LED element on a substrate; forming a light-shielding projection portion on the substrate around the LED element; and injecting a resin in between the substrate and a mold while bringing the mold into contact with the projection portion to perform a compression molding, thereby forming a resin layer.

In the method for producing a light-emitting device as described above, the step of mounting an LED element on the substrate and the step of forming a light-shielding projection portion can be performed in any order.

In the method for producing a light-emitting device as described above, the step of mounting an LED element on a substrate can include forming a reflector around an area of the substrate where the LED element is to be mounted to produce a stacked substrate, and the step of forming a projection portion can include forming a projection on the reflector.

According to still further another aspect of the presently disclosed subject matter, a light-emitting device can include: a substrate; at least one LED element mounted on the substrate; a reflector provided around the LED element; a resin layer including a convex portion covering the LED element and a thin film portion covering the reflector; and a light-shielding projection portion which is formed on the reflector and separates the convex portion and the thin film portion of the resin layer while the resin layer is not formed on the projection portion.

According to the presently disclosed subject matter, the reflective portion can be provided over the thin film portion surrounding the convex portion of the resin layer, thereby preventing the light generated in the thin film portion from being directly emitted outside. At the same time, the light can be reflected at the interface between the thin film portion and the reflective portion to be returned to the convex portion. Thereby, the color unevenness due to the generation around the convex portion can be prevented. Further, the light emitted around the convex portion and the light emitted upward from the LED element can be mixed together so that the color unevenness due to the direct light from the LED element is alleviated, achieving the uniform light emission as a whole.

According to another aspect of the presently disclosed subject matter, the projection portion can be pressed against, and brought in contact with, the mold during the compression molding. By doing so, the convex portion and the thin film portion of the resin layer can be surely separated from each other. Accordingly, in the completed light-emitting device, the light from the LED element can be prevented from entering the thin film portion through the convex portion of the resin layer as well as the thin film portion can be prevented from emitting light, whereby the light-emitting device can provide light emission with uniform color distribution.

BRIEF DESCRIPTION OF DRAWINGS

These and other characteristics, features, and advantages of the presently disclosed subject matter will become clear from the following description with reference to the accompanying drawings, wherein:

FIGS. 4A and 4B are diagrams each illustrating the principle of light emission from the light-emitting device of FIGS. 2A and B;

FIG. 7 includes diagrams illustrating one example of a method for producing the light-emitting device of FIGS. 6A and B (steps a to e);

FIGS. 8A, 8B, and 8C are plan views respectively illustrating modifications of the light-emitting device of FIGS. 6A and B;

FIGS. 11A and 11B are a cross-sectional view illustrating one example of a light-emitting device according to a third exemplary embodiment of the presently disclosed subject matter, and a plan view of the light-emitting device of FIG. 11A, respectively;

FIGS. 17A, 17B, 17C, 17D, and 17E are diagrams illustrating a fourth exemplary embodiment of a method for producing a light-emitting device of the presently disclosed subject matter;

FIGS. 20A and 20B are a plan view and a side view illustrating a ring-shaped member used in the production method shown in FIGS. 19A-19D; and FIGS. 21A, 21B, 21C, and 21D are diagrams illustrating the effects of either an Example or a Comparative Example of a method for producing a light-emitting device of the presently disclosed subject matter.

DESCRIPTION OF EXEMPLARY EMBODIMENTS

A description will now be made below to light-emitting devices of the presently disclosed subject matter with reference to the accompanying drawings in accordance with exemplary embodiments.

Figure 1A:
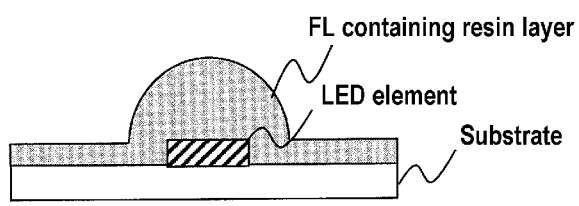
FIGS. 1A and 1B are a cross-sectional view of a conventional LED light-emitting device produced by a compression molding method, and a diagram illustrating the color separation of the projected light from the light-emitting device of FIG. 1A, respectively.
Figure 1B:
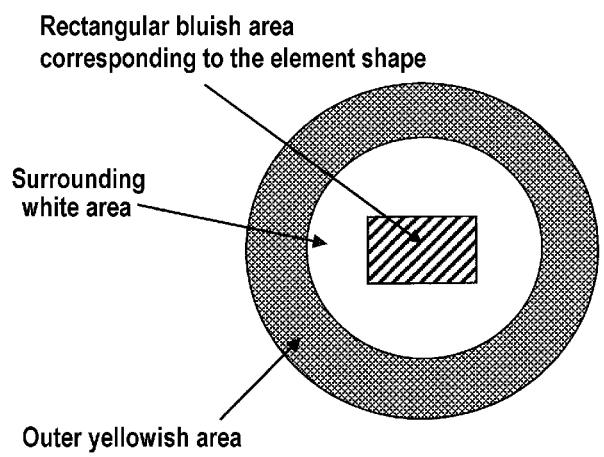
Figure 2A:
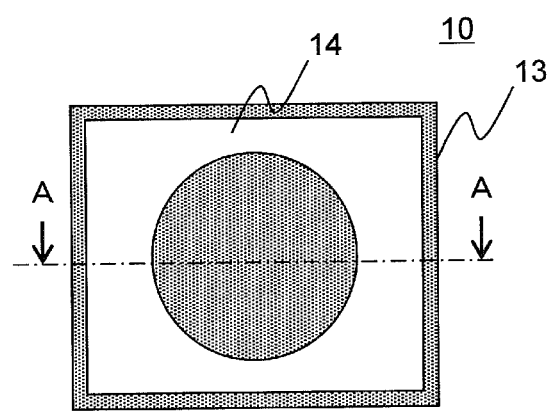
FIGS. 2A and 2B are a plan view illustrating one example of a light-emitting device according to a first exemplary embodiment of the presently disclosed subject matter, and a cross-sectional view of the light-emitting device of FIG. 2A taken along line A-A, respectively.
Figure 2B:
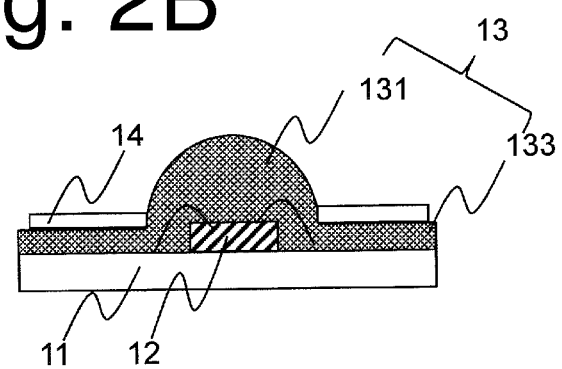

FIGS. 2A and 2B show one example of a light-emitting device according to the present exemplary embodiment, and are a plan view illustrating the light-emitting device, and a cross-sectional view of the light-emitting device of FIG. 2A taken along line A-A, respectively.

As illustrated, the light-emitting device 10 of the present exemplary embodiment can include a substrate 11, an LED element 12, a resin layer 13, and a reflective portion 14.

The substrate 11 can be composed of a planar member formed from ceramics such as $Al_2O_3$ and AlN, glass, epoxy resin, or a metal material such as Cu and Al. The thickness thereof is not particularly limited, but may be generally about 0.4 mm to about 1.0 mm. The substrate 11 can have an electrode and/or wiring formed on a surface where the LED element is to be mounted or a rear surface so that the LED element 12 can be electrically connected to external power source although they are not illustrated in the drawings. If the substrate 11 is formed from a metal material, an insulating portion or slit may be provided to electrically insulate positive and negative electrodes.

Examples of the LED element 12 may include a face-up element having two electrode terminals on its upper surface, a flip element having two electrode terminals on its lower surface, and a metal bond (MB) element. The size of the LED element is not particularly limited, but examples of the LED element may include an element with 0.5 mm length, 0.3 mm width, and 0.12 mm thickness (relatively small element), and an element having 1 mm or more sides (relatively large element).

The resin layer 13 can include a resin, a wavelength conversion material such as a fluorescent material (phosphor), and, if required, an additive such as a filler. The types of the resin are not particularly limited as long as the resin is suitable for the compression molding method. Examples of the resin may include silicone resins, hybrid resins of epoxy and silicone, epoxy resins, and urethane resins. In terms of reliability, silicone resins are possible. In order to provide high luminance, it is possible to use a resin with a high refractive index, but such a resin with a high refractive index is generally easy to deteriorate. Accordingly, if the light-emitting device is used with higher reliability, it is possible to use a resin with a low refractive index. It should be noted that the refractive index of the resin used can be adjusted by selection of the type of the resin, the content of the filler, and the like.

The wavelength conversion material can be a material that can absorb light emitted from the LED element (be excited by the light) and emit light with wavelengths different from the absorbed light (excitation light). The types of the wavelength conversion material can be selected depending on the color of the light emission of the employed LED element, the desired color of light to be emitted, and examples thereof may include nitride or oxynitride fluorescent materials, YAG fluorescent materials, BAM fluorescent materials (aluminate type blue fluorescent material), and SiAlON fluorescent materials. For example, $Y_3Al_5O_{12}:Ce^{3+}$ can be used as a yellow light emission fluorescent material, $Y_3(Al,Ga)_5O_{12}:Ce^{3+}$ can be used as a green light emission fluorescent material, and $CaAlSiN_3:Eu$ can be used as a red light emission fluorescent material.

Fillers can be used to adjust the viscosity of a sealing resin during the production process and to function as a diffusion material to reduce the color unevenness. The content of the fluorescent material and filler is not particularly limited, but in one exemplary embodiment it can be 5 to 80 wt %, and in another exemplary embodiment it can be 10 to 40 wt %, as a total content of the fluorescent material and filler with respect to the resin.

The shape of the resin layer 13 can include a substantially hemispherical convex portion 131 that can cover the LED element 13, and a thin film portion 133 disposed around the convex portion 131 and in parallel with the surface of the substrate 11.

Figure 3:
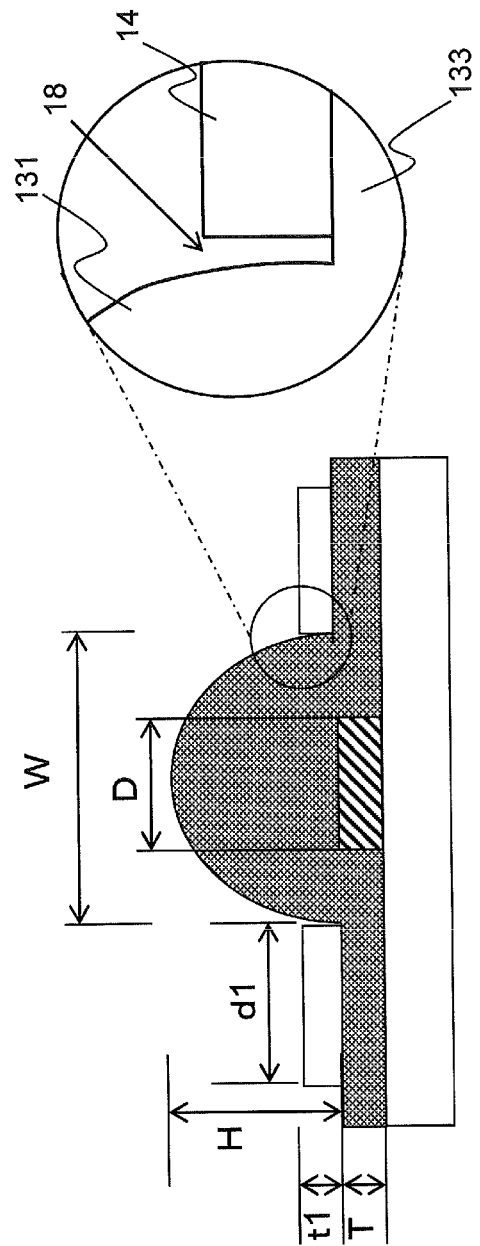
FIG. 3 is a cross-sectional view of the light-emitting device according to the first exemplary embodiment together with partial enlarged view.

The size of the hemispherical convex portion 131 may vary depending on the size of the LED element 13. For example, as shown in FIG. 3, when the width of the LED element 13 is D and the width of the convex portion in a direction parallel with the top surface of the LED element is W, W=D+2×0.6 (mm) or so. When the height of the convex portion from the top surface of the LED element is H, H=W/2 or so. For example, if the LED element has a width of 0.5 mm and a thickness of 0.12 mm, the shape of the convex portion 131 can be a hemispherical shape with a radius of 1.7 mm. By designing the shape as above, the optical path length from the light emission surface of the LED element or the upper surface thereof up to the surface of the convex portion 131 can be even.

The thickness T of the thin film portion 133 can be equal to or less than the thickness of the LED element 13, and in one exemplary embodiment it can be 0.1 mm or smaller. If the thickness of the thin film portion 133 exceeds the thickness of the LED element, the advantageous effects of the formation of the hemispherical convex portion 131 or the equalization of the optical path length may be hampered.

The reflective portion 14 can reflect light emitted from the resin layer 13 as well as can shield the light exiting outside at the interface between itself and the resin layer 13. The reflective portion 14 may be formed from a reflective material having such a function, a material totally reflecting light (such as a metal member or a mirror-finished member), or a diffusion reflection material. In particular, a diffusion reflection material, specifically a white reflection material is possible. If the reflective portion 14 is formed from a diffusion reflection material, the light generated from the thin film portion 133 of the resin layer 13 can be diffused to be directed to the convex portion 131, so that the mixing with the light directed upward from the LED element 12 can be effectively achieved as well as the production of the reflective portion 14 is facilitated.

Specifically, examples of the diffusion reflection material may include white resins prepared by mixing a white filler such as $TiO_2$, $Al_2O_3$, AlN, $SiO_2$, ZnO, etc. with a resin such as a silicone resin, a hybrid resin of epoxy and silicone, an epoxy resin, a urethane resin, etc. If the reflective portion 14 is formed by coating, it is possible to select a resin with an improved thixotropic property that facilitates the coating and has a favorable shape retention property after the layer formation. If the reflective portion 14 is formed by adhesion, examples of the reflective portion 14 may include white reflective plates formed from a ceramic material ($Al_2O_3$ or the like), a plastic material containing white filler ($TiO_2$ or the like), etc.

The reflective portion 14 can be formed over the thin film portion 133 of the resin layer 13 and outside the area of the convex portion 131. The thickness t1 of the reflective portion 14 in an exemplary embodiment can be 0.2 mm or more, and in another exemplary embodiment it can be 0.5 mm or more. If the thickness t1 of the reflective portion 14 is set to 0.2 mm or more, the light from the thin film portion 133 of the resin layer 13 disposed below the reflective portion 14 can be almost completely shielded by the reflective portion 14. The reflective portion 14 can ideally be provided over the entire surface of the thin film portion 133, but is not limitative. The width d1 from the outer peripheral of the convex portion 131 can be 0.2 mm or more in one exemplary embodiment, and can be 0.5 mm or more in another exemplary embodiment. If the width d1 of the reflective portion 14 is set to 0.2 mm or more, the light from the thin film portion 133 of the resin layer 13 can be sufficiently shielded by the reflective portion 14. In addition to this, the light from the thin film portion 133 of the resin layer 13 can be reflected by the same to the convex portion of the resin layer 13, so as to mix it with the light from the LED element 12.

The reflective portion 14 is not required to be in contact with the outer periphery of the convex portion 131. As shown in the enlarged view in FIG. 3, there may be a gap 18 between the side surface of the reflective portion 14 and the outer periphery of the convex portion 131. Part of the light emitted from the thin film portion 133 of the resin layer 13 exposed to the gap 18 can be reflected by side surface of the reflective portion 14 and enter the convex portion 131 of the resin layer 13. Another part of the light can be directly mixed with the light emitted from the convex portion 131 of the resin layer 13. This can suppress the color unevenness. The allowable distance of the gap 18 may vary depending on the thickness of the convex portion 131 of the resin layer 13 and/or the thickness of the reflective portion 14, and in one exemplary embodiment it can be 0.25 mm or less.

Next, the principle of suppressed or prevented color unevenness will be described with reference to FIG. 4A. In FIG. 4A, the trajectory of light generated from the thin film portion 133 of the resin layer 13 (surrounding yellowish light) is illustrated by a dot line, and the trajectory of light directed just above the LED device 12 (rectangular bluish light area) is illustrated by a dashed line. As illustrated, the light-emitting device of the present exemplary embodiment can be configured such that the light emitted from the top surface of the LED element 12 can be diffused radially and projected with almost the same color (for example, white) due to the equal optical path length within the convex portion 131 of the resin layer 13. However, the luminance of light emitted at the center of the top surface of the LED element 12 is the maximum, and the light emission color just above the LED element may be predominantly bluish. Further, the light emitted sideward from the LED element can cause the thin film portion 133 of the resin layer 13 to emit light, and the light emission color at that area may be predominantly yellowish. In the presently disclosed subject matter, the light from the thin film portion 133 of the resin layer 13 cannot be projected directly outside (upward direction in the drawing) due to the reflective portion 14 formed thereabove. Accordingly, the light can be reflected at the interface between the thin film portion 133 of the resin layer 13 to be directed to the convex portion 133 disposed at the center of the device. Therefore, the yellowish light thus directed and the bluish light upward from the LED element 12 can be mixed together, so as to provide the resulting white light from the convex portion 133. Accordingly, the rectangular bluish light directly above the LED element 12 and the yellowish light at the surrounding area can be prevented from occurring, thereby obtaining light emission without color unevenness.

Next, the method for producing a light-emitting device of the present exemplary embodiment will be described with reference to FIG. 5.

First, an LED element 12 is fixed on a package substrate 11 by die bonding, wire bonding, or the like, so as to be electrically connected thereto (step (a)). Next, a resin material for forming the resin layer is injected into a cavity formed between the mold 40 and the substrate 11 on which the LED element 12 has been mounted by compression molding, so as to form a resin layer 13 (step (b)). When the compression molding is performed, a release sheet (not illustrated) such as a fluorinated resin sheet can be present between the mold 40 and a resin, and vacuuming is carried out during the molding of resin. In this manner, the convex portion 131 that can cover the LED element 12 and the thin film portion 133 extending around the convex portion 131 can be formed as the resin layer 13. Next, a resin coating containing a white filler can be applied around the convex portion 131 by a dispenser 41 and cured to form the reflective portion 14 (step (c)).

Alternatively, a white reflective plate can be prepared to have an opening with the same inner diameter as the outer diameter of the convex portion 13. This white reflective plate can be adhered to the thin film portion 133 while pressed by a pressurizing member 42, to form the reflective portion 14 (step (d)).

According to the principle of the presently disclosed subject matter, the reflective portion 14 covering the thin film portion 133 of the resin layer 13 can be provided around the hemispherical convex portion 131 of the resin layer 13 that covers the LED element 12. This light-emitting device can be obtained by a simple production method while the color unevenness can be prevented.

Figure 6A:
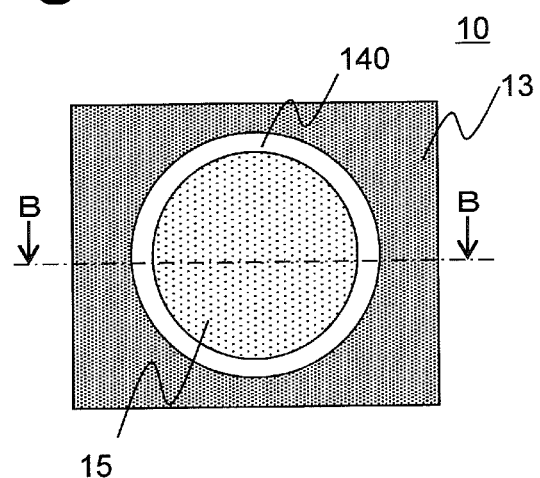
FIGS. 6A and 6B are a plan view illustrating one example of a light-emitting device according a second exemplary embodiment of the presently disclosed subject matter, and a cross-sectional view of the light-emitting device of FIG. 6A taken along line B-B, respectively.
Figure 6B:
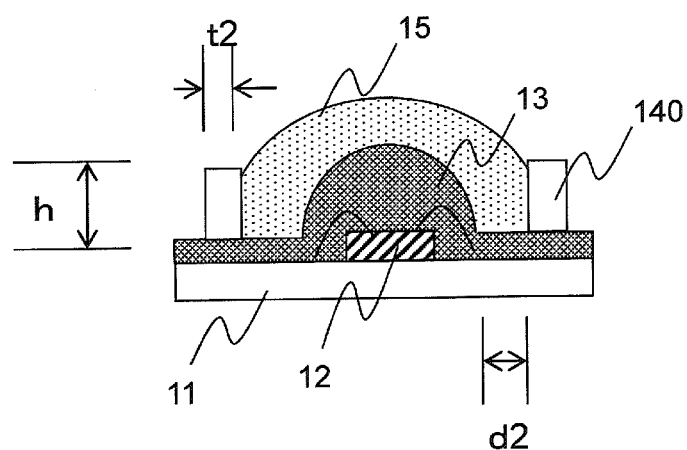

FIGS. 6A and 6B are a plan view illustrating one example of a light-emitting device according a second exemplary embodiment, and a cross-sectional view of the light-emitting device of FIG. 6A taken along line B-B. The same components as those in FIGS. 2A and 2B may be denoted by the same reference numerals.

As illustrated, the light-emitting device 10 of the present exemplary embodiment can include a substrate 11, an LED device 12, a resin layer 13, a reflective portion 140, and a diffusion layer 15.

The configuration of the substrate 11, LED device 12 and resin layer 13 is the same as the first exemplary embodiment, and the description thereof will be omitted here and a different point will be described.

Examples of the reflective portion 140 may be the same as those in the first exemplary embodiment. In the present exemplary embodiment, the reflective portion 140 can be a ring-shaped member, for example. The ring-shaped member can have an opening with an inner diameter larger than the outer diameter of the convex portion 131 so as to function as a sealing member for receiving the diffusion layer 15 between itself and the convex portion 131. The height h of the ring-shaped member in one exemplary embodiment can be half the height of the convex portion 131. The difference d2 between the inner diameter of the reflective portion 140 and the outer diameter of the convex portion 131 can be 0.25 mm or less in an exemplary embodiment.

As one example, if the height of the hemispherical convex portion 131 is 0.75 mm, the height h of the reflective portion 140 can be 0.375 mm or more. If the height and inner diameter (distance d2+the outer diameter of the convex portion 131) of the reflective portion 140 are set to fall within the above ranges, the hemispherical diffusion layer 15 can be formed to cover the convex portion 131. Further, it is possible to suppress the color unevenness due to the light emission form the thin film portion 133 of the resin layer 13 between the reflective portion 140 and the convex portion 131. The thickness (ring thickness) t2 of the reflective portion 140 as the horizontal section in one exemplary embodiment can be 0.2 mm or more. With this configuration, almost all the light emitted from the thin film portion 133 that would be a cause for the generation of color unevenness can be reflected at the interface between the thin film portion 133 and the reflective portion 140 so as to be direct to the convex portion 131.

The reflective portion 140 may be formed by coating like in the first exemplary embodiment. Or alternatively, the reflective portion 140 may be provided as a ring-shaped member formed from a ceramic material or a white filler containing plastic material by adhering it to the thin film portion 133 of the resin layer 13 via an adhesive.

The diffusion layer 15 can include a light diffusing agent, a resin material, and if required, an additive. Examples of the light diffusing agent may include fillers such as $TiO_2$, $Al_2O_3$, AlN, $SiO_2$, and ZnO. Examples of the resin may include silicone resins, hybrid resins of epoxy and silicone, epoxy resins, and urethane resins. In terms of its reliability, silicone resins are possible and can provide desirous qualities. The content of the filler in one exemplary embodiment can be 0.5 to 20 wt %, and in another exemplary embodiment it can be 0.5 to 10 wt %, with respect to the resin in order to achieve both the light diffusing property and the light transmitting property.

Next, the principle of suppressed or prevented color unevenness will be described with reference to FIG. 4B. In the example of FIG. 4B, the thin film portion 133 of the resin layer can emit yellowish light as in FIG. 4A. The light travelling through the inside of the resin layer 13 is the same as in FIG. 4A, and a description thereof is omitted here. Then, the light emitted from the thin film portion 133 of the resin layer 13 to the diffusion portion 15 is denoted by dotted lines. Unlike the case of FIG. 4A, the thin firm portion 133 positioned between the convex portion 131 and the reflective portion 140 is not covered with the reflective portion 140. Accordingly, the yellowish light emitted from the thin film portion 133 at that area can enter the diffusion portion 15. Thus, the light diffused by the contained light diffusing agent can be directed directly to the center of the convex portion 133 or reflected by the side surface of the reflective portion 140 while directed directly to the center of the convex portion 133, thereby mixing the light with the light from the LED element 12. Some of the light can enter the convex portion 131 to be mixed with the light from the LED element 12. Accordingly, if the diffusion portion 15 is not present, the color distribution is different at the area directly above the LED element and at the area directly above the thin film portion 133. However, such the color distribution can be averaged by the diffusion portion 15, so that a uniform color distribution can be obtained as a whole. It should be noted that the light emitted from the thin firm portion 133 and reflected at the interface between the thin film portion 133 and the reflective portion 140 can contribute to the suppression of the color unevenness as in the case of FIG. 4A.

Next, an exemplary method for producing a light-emitting device of the present exemplary embodiment will be described with reference to FIG. 7.

Figure 5:
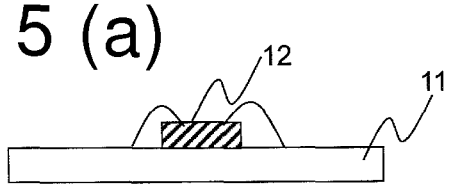
FIG. 5 includes diagrams illustrating one example of a method for producing the light-emitting device according to FIGS. 2A and B (steps a to d)
Figure 5:
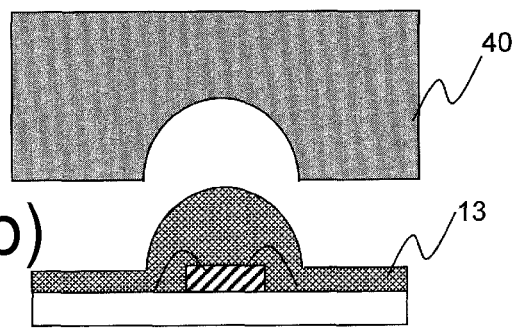
Figure 5:
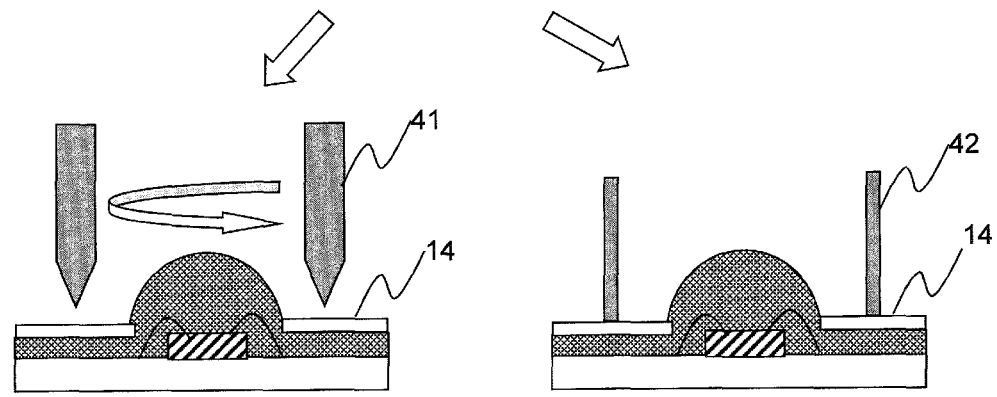

In the present exemplary embodiment, the step of mounting an LED element on a substrate (step a) and the step of forming a resin layer by the compression molding (step b) are the same as the method for producing the light-emitting device of the first exemplary embodiment as shown in FIG. 5. In the step of forming the reflective portion 140 (step c or step d), the reflective portion 140 can be formed to have a certain distance separated away from the outer periphery of the convex portion 131 of the resin layer 13 and a height that is half of, or higher than, the height of the convex portion 131. Then, a resin containing a diffusing agent can be injected into the closed space by the reflective portion 140, and cured to form the diffusion portion 15 covering the convex portion 131.

According to the present exemplary embodiment, in addition to the advantageous effects by the first exemplary embodiment, a further effect for eliminating the color unevenness by the diffusion portion 15 can be provided.

The present exemplary embodiment can be modified in accordance with intended purposes. FIGS. 8A, 8B, and 8C are plan views respectively illustrating modifications of the shapes of the reflective portion 140 and the diffusion portion 15, and FIGS. 9A and 9B and 10 are cross-sectional views respectively illustrating modifications of the light-emitting device.

FIGS. 8A, 8B, and 8C show modifications wherein the outer shape of the reflective portion 140 is rectangular, hexagonal, or cross-shaped (a rectangle with square cuts at its four corners), respectively.

Figure 9A:
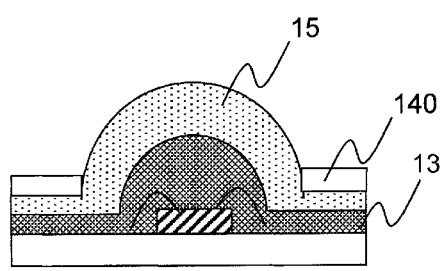
FIGS. 9A and 9B are cross-sectional views respectively illustrating modifications of the light-emitting device of FIGS. 6A and B.
Figure 9B:
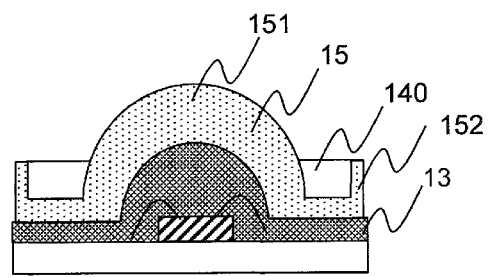

With regard to the configurations of the modifications as shown in FIGS. 9A and 9B, the diffusion portion 15 can be formed by coating a resin containing a diffusing agent over the entire surface of the resin layer 13. Then, the reflective portion 140 can be formed to cover the diffusion portion 15 around the convex portion 151 corresponding to the convex portion 131 of the resin layer 13. Specifically, the light-emitting devices shown in FIGS. 9A and 9B can be produced by, after forming the resin layer 13 by the compression molding method and before forming the reflective portion 140 in the production method shown in FIG. 7, forming the diffusing agent-containing resin layer (diffusion portion) 15 by the compression molding method or transfer molding method. Then, with the method illustrated in step c or d of FIG. 7, the reflective portion 140 can be formed around the diffusion portion 15. Specifically, the modification of FIG. 9B is configured to include forming an upright portion 152 is formed at the peripheral edge of the diffusion portion 15 during the compression molding or transfer molding. Then, a diffusing agent-containing resin (or white filler-containing resin) can be injected in the recessed portion formed between the convex portion 151 and the upright portion 152 and cured to form the reflective portion 140. In these modifications, the formation of the reflective portion 140 can be facilitated, and be formed in close contact with the convex portion 151. Accordingly, the light from the thin film portion 133 of the resin layer 13 can be prevented from being projected directly outward as is.

Figure 10:
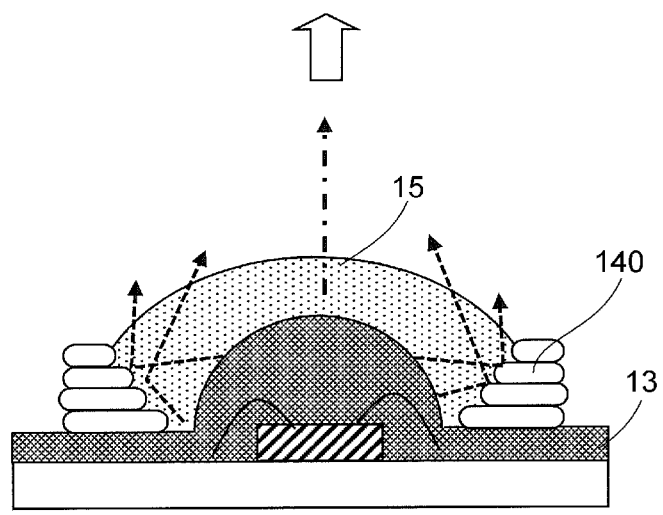
FIG. 10 is a cross-sectional view illustrating a modification of the light-emitting device of FIGS. 6A and B.

FIG. 10 shows another modification in which the reflective portion 140 has a different cross-section. In the illustrated example, the reflective portion 140 can be composed of a plurality of stacked layers as a reflective member different from each other in area so that the upper reflective member has a smaller area than a lower reflective member. Accordingly, the stacked reflective member can have a tapered inside wall opened upward. This type of reflective portion 140 can be formed by repeating the step of coating a white filler-containing resin coating (like in step c of FIG. 7) or by repeating the step of adhering a white reflective plate (like in step d of FIG. 7). In the latter case, a plurality of white reflective plates with different areas so as to be sequentially stacked, or a ring-shaped white reflective member having an inclined or stepped inner surface with an upward opening can be prepared in advance and adhered to the resin layer 13. Then, like in step e of FIG. 7, the diffusing agent-containing resin can be injected in between the reflective portion 140 and the convex portion 131 and cured to form the diffusion portion 15.

Since the shape of the reflective portion 140 can be changed as above, in addition to the advantageous effects of the suppression of the color unevenness by the light reflection at the interface between the resin layer 13 and the reflective portion 140 as described above, the light distribution can be controlled by the inclination or the shape of the step of the inner wall of the reflective portion 140. Further, the reflected light from the reflective portion 140 can pass through the diffusion portion 15, to thereby suppress further the color unevenness.

The first and second exemplary embodiments are described as having a single LED element on a substrate. However, the presently disclosed subject matter is not limited thereto, and can be applied to the cases where a plurality of LED elements are mounted on a substrate, which will be described below.

FIGS. 11A and 11B are a cross-sectional view illustrating one example of a light-emitting device according the third exemplary embodiment of the presently disclosed subject matter, and a plan view of the light-emitting device of FIG. 11A. In the illustrated example, the light-emitting device can include LED elements arranged in a matrix shape of two×six. In this light-emitting device, the plurality of LED elements 12 can be mounted on the substrate 110 while electrically connected, and then, the resin layer 130 containing a fluorescent material can be formed over the entire surface by a compression molding method. In this case, the resin layer 130 can include convex portions 131 corresponding to the respective LED elements 12 and a thin film portion 133 disposed between (around) the respective convex portions 131. Then, a reflective portion 1400 can be formed to cover the thin film portion 133. Examples of the formation method of the reflective portion 1400 may include, as in the first and second exemplary embodiments, a method of coating and curing a resin containing a white filler by a dispenser or the like and curing the resin, a method of adhering a white thin plate having openings corresponding to the convex portions 131 with an adhesive or the like.

In the present exemplary embodiment, the reflective portion 1400 can cover the area between the convex portions covering the respective LED elements. Accordingly, the light from the thin film portion 133 (yellowish light) can be prevented from being directly projected outside as well as the color unevenness of light projected from the convex portions 131 can be improved by effectively reflecting the yellowish light by the reflective portion 1440 to the convex portions 131.

The light-emitting device shown in FIGS. 11A and 11B has been shown without a diffusion portion, but the presently disclosed subject matter is not limited thereto. The same change as in the modifications shown in FIGS. 9A and 9B can be applied to the light-emitting device shown in FIGS. 11A and 11B, thereby achieving high color unevenness suppression effect.

Next, a description will be given of an illuminating device made in accordance with principles of the presently disclosed subject matter.

Figure 12A:
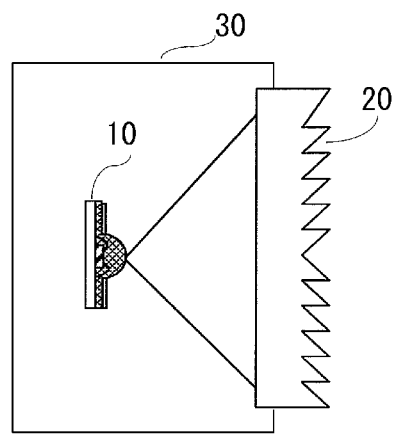
FIGS. 12A and 12B are diagrams illustrating examples of an illuminating device to which the presently disclosed subject matter is applied.

FIG. 12A shows parts of a typical illuminating device to which the presently disclosed subject matter can be applied. The illustrated illuminating device can include an LED light source 10 (light-emitting device), a Fresnel lens 20, and a housing 30 for accommodating the LED light source 10 and fixing the Fresnel lens 20. The housing 30 can include a circuit substrate for driving the LED light source 10 and a cooling mechanism such as a cooling fin or the like which are not illustrated in the drawings. Here, the LED light source 10 can be the light-emitting device of the presently disclosed subject matter, and examples thereof may include those described in FIGS. 2A, 2B, 6A, 6B, 11A, and 11B. The Fresnel lens 20 can be a single cylindrical Fresnel lens 20 if the light source 10 is a single package element as shown in FIGS. 2A and 2B or in FIGS. 6A and 6B. If the light source 10 is a multi-package element as shown in FIGS. 11A and 11B, the Fresnel lens can be a series of a plurality of cylindrical Fresnel lenses corresponding to the respective arrayed elements or a linear Fresnel lens.

The light emitted from the light source 10 can be converged by the Fresnel lens 20 to be projected forward. In general, if the light source 10 has color unevenness in the emitted light, the color unevenness becomes prominent in the case of the Fresnel lens more than in the case of a typical convex lens. The illuminating device of the presently disclosed subject matter can provide light emission with less color unevenness due to the use of the light-emitting device with suppressed color unevenness.

Figure 12B:
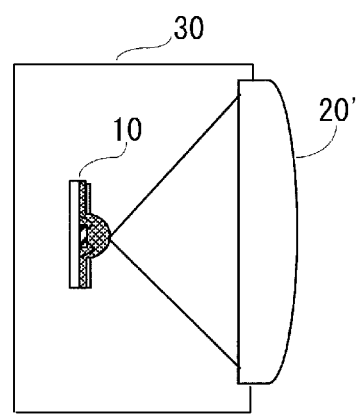

In FIG. 12A, the illuminating device utilizes a Fresnel lens as one example as an optical condensing member, but the presently disclosed subject matter is not limited thereto. For example, the presently disclosed subject matter can be applied to the illuminating device with a convex lens 20' as shown in FIG. 12B or with a reflector.

Examples

In order to confirm the advantageous effects of the presently disclosed subject matter, light-emitting devices with the configurations shown in FIGS. 13A to 13E were produced and the color unevenness was evaluated.

Figure 13A:
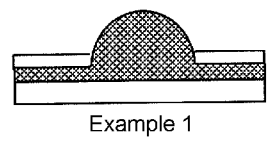
FIGS. 13A, 13B, 13C, 13D, and 13E are cross-sectional views each illustrating a light-emitting device as either an Example or a Comparative Example.

The light-emitting device shown in FIG. 13A was prepared based on the structure of the first exemplary embodiment shown in FIGS. 2A and 2B as Example 1, and the reflective portion was formed from a white filler-containing resin, in which the filler is $TiO_2$, the resin is a silicone resin, and the content of the filler is 10 wt %, with a thickness of 0.2 mm.

Figure 13B:
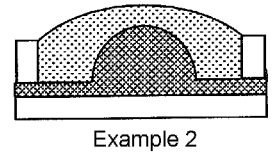

The light-emitting device shown in FIG. 13B was prepared based on the structure of the second exemplary embodiment shown in FIGS. 6A and 6B as Example 2, and the ring-shaped reflective portion was formed from the same resin as in the first example with a thickness of 0.2 mm, and a diffusing agent-containing resin, in which the diffusing material is $Al_2O_3$, the resin is a silicone resin, and the content of the diffusing material is 5 wt %, was filled in a recess within the ring-shaped reflective portion.

Figure 13C:

The light-emitting device shown in FIG. 13C was prepared in the same manner as in the example except that the resin layer was produced by the compression molding method without the reflective portion as Comparative Example 1.

Figure 13D:
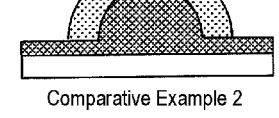

The light-emitting device shown in FIG. 13D was prepared by coating the same diffusing agent-containing resin as in Example 2 over the convex portion of the light-emitting device as shown in FIG. 13C to form a diffusion layer with a thickness of 0.1 mm as Comparative Example 2.

Figure 13E:
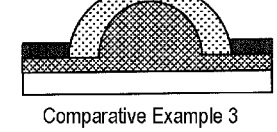

The light-emitting device shown in FIG. 13E was prepared by providing a light absorbing portion (being a black resin layer with a thickness of 0.2 mm) instead of the reflective portion over the structure of the light-emitting device illustrated in FIG. 13D as Comparative Example 3.

In any of the light-emitting devices, the LED element was a face-up type element (formed from a semiconductor layer of GaN material on a transparent sapphire transparent substrate) with 0.2 mm (length)×0.5 mm (width)×0.12 mm (thickness). The convex portion of the resin layer had a height of 0.75 mm and a diameter of 1.5 mm. The thickness of the thin film portion was 0.2 mm.

The LED element of each of the light-emitting devices of Examples and Comparative Examples was supplied with power, and the color of light emission was observed from above the device. Evaluation criteria was as follows:

AA: color unevenness was not completely observed.
A: almost no color unevenness was observed.
B: although there is an effect for suppressing the color unevenness, surrounding yellowish light and/or bluish light directly above the element was observed.
C: Surrounding yellowish light and/or bluish light directly above the element was clearly observed.

The results are shown in Table 1.

surely suppressed. In particular, the light-emitting device of Example 3 provided with the diffusion portion could provide light emission with superior uniform color. Further, as seen from the comparison between Example 1 and Comparative Example 3, when the light absorbing portion was provided instead of the reflection portion around the convex portion, the yellowish light emitted around the convex portion was suppressed. However, the light absorbing portion absorbed the yellowish light from the thin film portion, so that the light reflected at the interface between the thin film portion and the reflection portion couldn't be utilized effectively. Accordingly, even when the diffusion portion was provided, the square bluish area above the element couldn't be suppressed sufficiently.

Hereinbelow, a description will be given of a method of producing another light-emitting device and the light-emitting device produced by this method according to an exemplary embodiment of the presently disclosed subject matter.

Figure 14A:
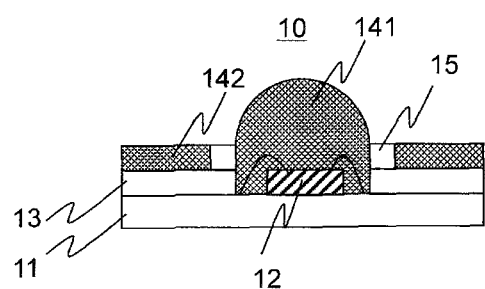
FIGS. 14A and 14B are a cross-sectional view and a plan view, respectively, illustrating one exemplary embodiment of a light-emitting device produced by a method for producing a light-emitting device of the presently disclosed subject matter.
Figure 14B:
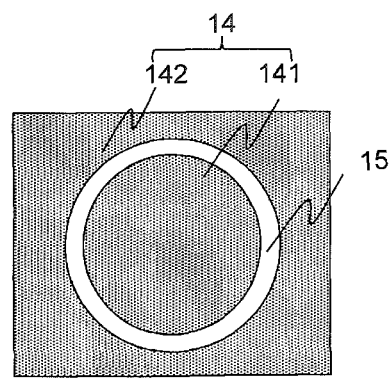

FIGS. 14A and 14B show the configuration of the light-emitting device. The light-emitting device 10 shown in FIGS. 14A and 14B can include as main components a substrate 11, an LED element 12 mounted on the substrate 11, a reflector 13 provided around the LED element 12, a resin layer 14 formed over the LED element 12 and the reflector 13 by a compression molding method and including a convex portion 141 covering the LED element 12 and a thin film portion 142 covering the reflector 13, and a projection portion 15 separating the convex portion 141 and the thin film portion 142.

The substrate 11 can be composed of a planar member formed from ceramics such as $Al_2O_3$ and AlN, glass, epoxy resin, or a metal material such as Cu and Al. The thickness thereof is not particularly limited, but may be generally about 0.4 mm to about 1.0 mm, and if the reflector 13 is provided, the total thickness of the substrate 11 and the reflector 13 may be about 0.5 mm to about 1.5 mm. The substrate 11 can have an electrode and/or wiring formed on a surface where the LED element is to be mounted or a rear surface so that the LED element 12 can be electrically connected to external power source although they are not illustrated in the drawings. If the substrate 11 is formed from a metal material, an insulating portion or slit may be provided to electrically insulate positive and negative electrodes.

Examples of the LED element 12 may include a face-up element having two electrode terminals on its upper surface,

TABLE 1

|  | Example 1 | Example 2 | Comparative Example 1 | Comparative Example 2 | Comparative Example 3 |
|---|---|---|---|---|---|
| Structure | RP: Present DP: None | RP: Present DP: Present | RP: None DP: None | RP: None DP: Present | RP: Present DP: Present |
| Evaluation on Color Unevenness | A | AA | C | B | C |
| Misc. | Rectangular bluish area and surrounding yellowish area were slightly observed, but not noticeable. | Rectangular bluish area and surrounding yellowish area were not observed. | Rectangular bluish area and surrounding yellowish area were noticeable. | Rectangular bluish area was still noticeable although surrounding yellowish area was suppressed. | Rectangular bluish area was still noticeable and the luminance was decreased although surrounding yellowish area was suppressed. |

RP: Reflective portion
DP: Diffusion portion

As seen from the results in Table 1, the light-emitting devices of Examples made in accordance with the principles of the presently disclosed subject matter could provide light emission with uniform color while the color unevenness was a flip element having two electrode terminals on its lower surface, and a metal bond (MB) element having two upper and lower electrode on respective surfaces. In FIGS. 14A and 14B, the light-emitting device utilizes a face-up element. In particular, since the face-up element and the flip element can emit light from the side surface with a translucent substrate, the advantageous effects of the presently disclosed subject matter is remarkable for such an element. The size of the LED element is not particularly limited, but examples of the LED element may include an element with 0.5 mm length, 0.3 mm width, and 0.12 mm thickness (relatively small element), and an element having 1 mm or more sides (relatively large element).

The reflector, which is not an essential component, can be provided to the light-emitting device 10, whereby the light emitted from the side surface of the LED element 13 can be reflected at the interface between the reflector 13 and the convex portion 141 of the resin layer 14 covering the LED element 12 to the inside of the convex portion 141 of the resin layer 14. In this manner, more light can be projected from the convex portion 141 of the resin layer 14 upward, thereby suppressing the rectangular bluish area above the LED element. The reflector 13 can function as a structure for compensating for the height of the projection portion 15 when the projection portion 15 is formed as described later, thereby facilitating the formation of the projection portion 15 which is a fine structure body.

The reflector 13 can be formed from the same material as that for the substrate 11, for example, from a ring-shaped plate surrounding the LED element 13 so that the plate is stacked on the substrate 11.

The resin layer 14 can be formed by a compression molding method utilizing a mold. The resin layer 14 can be configured to include the hemispherical lens-shaped convex portion 141 formed over the LED element 12, and the thin film portion 142 extending around the convex portion 141. The thin film portion 142 is not a layer required for the function of the light-emitting device, but a layer inevitably formed during the compression molding. The thickness of the thin film portion 142 may be regulated by the height of the projection portion 15 described later.

The resin layer 14 can include a resin, a wavelength conversion material such as a fluorescent material (phosphor), and, if required, an additive such as a filler. The types of the resin are not particularly limited as long as the resin is suitable for the compression molding method. Examples of the resin may include silicone resins, hybrid resins of epoxy and silicone, epoxy resins, and urethane resins. In terms of reliability, silicone resins are possible. In order to provide high luminance, it is possible to use a resin with a high refractive index, but such a resin with a high refractive index is generally easy to deteriorate. Accordingly, if the light-emitting device is used with higher reliability, it is possible to use a resin with a low refractive index. It should be noted that the refractive index of the resin used can be adjusted by selection of the type of the resin, the content of the filler, and the like.

The wavelength conversion material can be a material that can absorb light emitted from the LED element (be excited by the light) and emit light with wavelengths different from the absorbed light (excitation light). The types of the wavelength conversion material can be selected depending on the color of the light emission of the employed LED element, the desired color of light to be emitted, and examples thereof may include nitride or oxynitride fluorescent materials, YAG fluorescent materials, BAM fluorescent materials (aluminate type blue fluorescent material), and SiAlON fluorescent materials. For example, $Y_3Al_5O_{12}:Ce^{3+}$ can be used as a yellow light emission fluorescent material, $Y_3(Al,Ga)_5O_{12}:Ce^{3+}$ can be used as a green light emission fluorescent material, and nitride or oxynitride fluorescent materials such as $CaAlSiN_3:Eu$ can be used as a red light emission fluorescent material.

Fillers can be used to adjust the viscosity of a sealing resin during the production process and to function as a diffusion material to reduce the color unevenness. The content of the fluorescent material and filler is not particularly limited, but in one exemplary embodiment it can be 5 to 80 wt %, and in another exemplary embodiment it can be 10 to 40 wt %, as a total content of the fluorescent material and filler with respect to the resin.

The projection portion 15 can function to separate the convex portion 141 of the resin layer 14 for covering the LED element 12 and the thin film portion 142 extending around the convex portion 141 by being brought into contact with the mold during the compression molding of the resin layer 14. With this configuration, the light from the side surface of the convex portion 141 can be prevented from entering the thin film portion 142, thereby preventing the occurrence of color unevenness due to the different color of light emission from the thin film portion 142. In addition to this, the projection portion 15 can reflect the light from the convex portion 141 at the interface between itself and the convex portion 141, thereby functioning like the reflector 13 if the reflector 13 extend vertically.

The size and the material of the projection portion 15 can be selected so as to withstand the pressure during the compression molding as well as to shield light. Examples of the material of the projection portion 15 may include the same material as those for the substrate 11 and the reflector 13, resins containing a white filler, and the like. If the projection portion 15 is formed from the same material as that of the substrate 11, specifically, from a highly rigid material such as a ceramic, metal, glass epoxy, and the like, the projection portion 15 can withstand the pressurized contact with the mold even with a relatively thin thickness while achieving a high light shielding property. If the projection portion 15 is formed from a white-filler containing resin, the thickness of the projection portion 15 should be thicker than that formed from ceramics in order to provide sufficient light shielding effects. However, the projection portion 15 formed from the white-filler containing resin can elastically deform against the pressure during the compression molding, thereby achieving favorable close contact with the mold. Therefore, any thin film resin layer cannot be formed over the projection portion 15, and the projection portion 15 can surely separate the convex portion 141 and the thin film portion 142 of the resin layer 14.

The width of the projection portion 15 (the size in a direction parallel with the substrate surface, the same meaning applying to the following description) in one exemplary embodiment can be 0.1 mm or larger for the ceramic made rigid portion so as to shield the light between the convex portion 141 and the thin film portion 142 of the resin layer 14. If the width is 0.1 mm or larger, the light shielding property is not changed depending on the wider width. The projection portion 15 with too wide width may affect on the molding pressure on the mold. In this case, if the substrate warps, the projection portion formed over the area where the substrate does not warp may possibly be destroyed. Taking this into consideration, the width of the projection portion 15 in another exemplary embodiment can be 1.0 mm or smaller. If a plurality of light-emitting devices are produced while simultaneously subjected to compression molding, when the width of the projection portion 15 is 0.5 mm at most, the projection portion can be brought into contact with the mold even with the substrate 11 warping within a tolerance. In yet another exemplary embodiment, the projection portion 15 formed from the white-filler containing resin can have a width of 0.2 mm or larger.

The height of the projection portion 15 (the size in a direction perpendicular to the substrate surface, the same meaning applying to the following) in one exemplary embodiment can be 0.05 mm or larger independent of the types of material while taking the process accuracy into consideration. In order to prevent the light from the side surface of the convex portion 141 of the resin layer 14 from exceeding the projection portion 15 to enter the thin film portion 142, the total height of the projection portion 15 and the reflector 13 can be the same or larger than the thickness of the LED element 12. For example, if the thickness of the LED element 12 is 0.12 mm, the total height of the projection portion 15 and the reflector 13 can be 0.12 mm or larger. If there is no reflector 13, when the height of a projection portion 15 with a thin width (for example, a width of 0.1 mm or so) is set to the same as or larger than the LED element 12 in thickness, there is a possibility in which the strength of the projection portion 15 against the pressure during the compression molding cannot be ensured. However, the light-emitting device of the present exemplary embodiment can include the reflector 13 and the projection portion 15 on the reflector 13, and therefore, the height of the projection portion 15 can be reduced so as to withstand the pressure during the compression molding. Furthermore, such the projection portion 15 can prevent the light from the side surface of the LED element 12 via the convex portion 141 of the resin layer 14 from exceeding the projection portion 15 to enter the thin film portion 142.

The method for forming the projection portion 15 can be changed depending on the material to be used for the projection portion 15. Examples thereof may include a method of stacking a projection portion formed from the same material as that of a substrate on the substrate, a method of forming a projection portion from a white-filler containing resin, and a method of adhering a white reflective plate on a substrate to serve as the projection portion.

Figure 15:
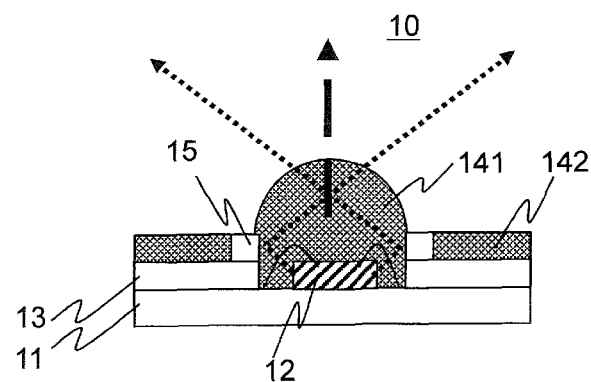
FIG. 15 is a diagram illustrating the light emission status of the light-emitting device of FIGS. 14A and 14B.

FIG. 15 illustrates the light emission status of the light-emitting device with the above configuration. As illustrated, suppose the case where the LED element 12 can emit light via its side surface as well as its top surface. In this case, the light emitted via the top surface can propagate the hemispherical convex portion 141 of the resin layer 14. Accordingly, the light without color unevenness due to the different optical path length can be projected from the convex portion 141 of the resin layer 14. The light from the side surface can be reflected at the interface between the convex portion 141 and the reflector 13 and between the convex portion 141 and the projection portion 15 to return to the convex portion 141 so that the light can be diffused and projected from the top surface of the convex portion 141. Since the projection portion 15 can surely separate the convex portion 141 and the thin film portion 142 disposed on the reflector 13, any light from the LED element cannot enter the thin film portion 142, whereby the thin film portion 142 cannot emit light (yellowish light compared with the light from the convex portion 141). Therefore, the light emission without color unevenness can be provided as an entire light-emitting device.

While the light-emitting device shown in FIGS. 14A and 14B can employ a single LED element, the presently disclosed subject matter can be applied to a light-emitting device with a plurality of LED elements.

Figure 16A:
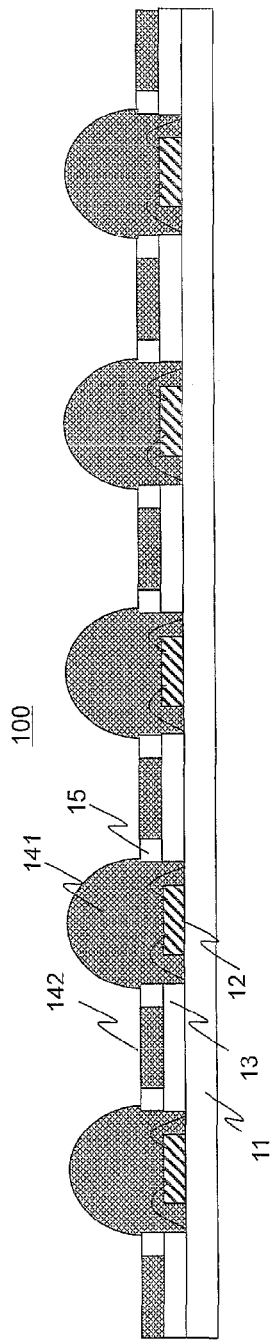
FIGS. 16A and 16B are a cross-sectional view and a plan view, respectively, illustrating another exemplary embodiment of a light-emitting device produced by a method for producing a light-emitting device of the presently disclosed subject matter.
Figure 16B:
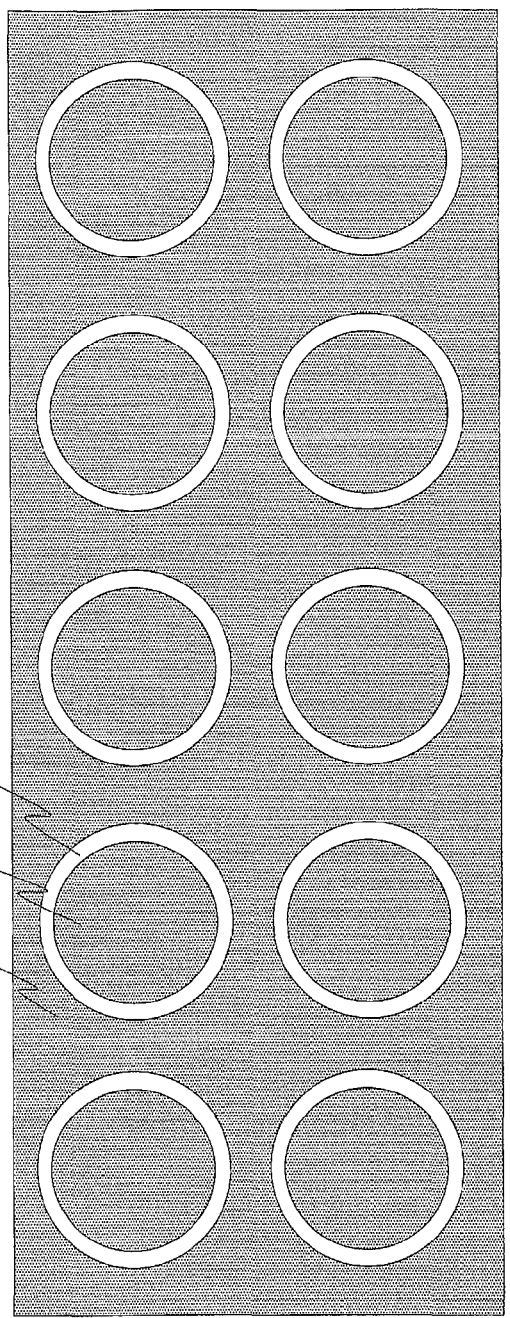

FIGS. 16A and 16B illustrate another exemplary embodiment of a light-emitting device 100 utilizing a plurality of LED elements. The light-emitting device 100 can include a plurality of LED elements which are the same as that in the light-emitting device 10 of the exemplary embodiment shown in FIGS. 14A and 14B and arranged in a two-dimensional manner. In the drawing, ten LED elements are arranged in 2×5 array, however, the number and arrangement of the elements are not limited to the illustrated example. For example, the light-emitting device can include a plurality of LED elements arranged in line, in a square shape, and the like.

Since the components constituting the light-emitting device 100 are the same or similar to those in the exemplary embodiment shown in FIGS. 14A and 14B, the description therefor is omitted here, and a description will be given of the different points. The distance between the adjacent LED elements can take any value depending on the size of the LED element, the number of the elements, the type of the light-emitting device, and the like as long as the advantageous effects of the presently disclosed subject matter can be derived.

The width of the projection portion 15 can be 0.1 mm or larger and 1.0 mm or smaller as in the exemplary embodiment shown in FIGS. 14A and 14B irrespective of the size of the convex portion 141 of the resin layer 14 covering the LED element and the distance between the adjacent LED elements. In the light-emitting device 100 with the plurality of LED elements arranged, the width may be 0.5 mm or larger in view of the possible warpage of the substrate 11. According to the presently disclosed subject matter, the projection portion should be brought into pressure contact with the mold during the compression molding. If there is a warpage of the substrate, some of the projection portions may not be brought into contact with the mold in some cases. However, if the width of the projection portion is designed to have a certain dimension, the effect of the warpage of the substrate can be absorbed so that the pressure contact with the mold can be achieved surely.

The method for forming the projection portion 15 can include the same methods as in the exemplary embodiment shown in FIGS. 14A and 14B, specifically, examples thereof may include a method of stacking a projection portion formed from the same material as that of a substrate on the substrate, a method of forming a projection portion from a white-filler containing resin, and a method of adhering a white reflective plate on a substrate to serve as the projection portion.

The light-emitting device shown in FIGS. 16A and 16B can be suitably used for a surface light source or a linear light source, for example, for the purposes of a backlight for a TV set, a light source for a general illuminating device.

Next, a description will be given of a method for producing the above-mentioned light-emitting device. As described, an exemplary method for producing the light-emitting device according to the presently disclosed subject matter can employ various methods depending on the material constituting the projection portion.

Process steps of the production method are illustrated in FIGS. 17A to 17E. As shown in FIG. 17A, a package substrate 11 is prepared to have a wiring pattern (not shown) for installing an LED element. Then, a base material for a reflector 13 and a base material for a projection portion 15 are stacked in this order on the substrate 11 to fabricate a stacked substrate 17. The base material for the reflector 13 can be the same material as that of the substrate 11 and have the same outer contour as the substrate 11 while a center area is cut off corresponding to the convex portion to be formed. The base material for the projection portion 15 can be a ring-shaped substrate having an opening with the same size as that of the reflector base material. The width of the base material for the projection portion 15 can be 0.1 mm or larger and the height thereof can be 0.05 mm or larger.

If the components forming the stacked substrate 17 are made of ceramics, the stacking method may include stacking green sheets before firing having the same outer contours corresponding to those of the reflector 13 and the projection portion 15 onto the substrate 11, and firing the stacked body simultaneously. In this case, the sizes of the green sheets should be larger than the actual size with the shrinkage during firing being taken into consideration. If the substrate 11 is made of metal, the base materials made of metal can be bonded by diffusion bonding to produce the stacked substrate 17. If the substrate 11 is made of a resin such as a glass epoxy substrate, they are bonded together with an adhesive to produce the stacked substrate 17.

Next, an LED element 12 can be mounted on the package substrate after stacked. If the LED element 12 is a face-up element as shown in the drawing, first the LED element 12 is die-bonded onto the substrate 11 and then upper electrodes of the LED element 12 are wire-bonded using gold wires for electrical connection (see FIG. 17B). If the LED element 12 is a flip type element or an MB element, the LED element 12 can be electrically connected via Au bumps instead of wire bonding.

Subsequently, a mold 20 is utilized to perform compression molding of a resin to form a resin layer 14 (See FIGS. 17C and 17D). The mold 20 may include a plurality of recessed portions for forming the resin layer 14 sealing the LED element. Specifically, when performing the compression molding, a release film 30 is mounted on the mold 20, and then the stacked substrate 17 with the LED element mounted is positioned so as to cause the LED element 12 to overlap the position of the recessed portion. Then, a liquid resin 140 is injected into the recessed portion of the metal via the release film 30. During the compression molding, the vacuuming is performed while the gap between the mold 20 and the stacked substrate 17 (a gap at the ends of both members) is set to several hundreds micrometers, so that air bubbles contained in the resin are removed while the resin is uniformly filled in between the mold 20 (the release film 30) and the stacked substrate 17. Then, the metal mold is brought into pressure contact with the stacked substrate 17 to perform the compression molding of the resin. During this process, the projection portion 15 of the stacked substrate 17 can abut on the flat area around the recess portion of the metal mold 20 (in a strict sense, the projection portion 15 can abut on the release film 30 disposed on the mold 20). Accordingly, the projection portion 15 can completely separate the convex portion 141 of the resin layer 14 molded in the recessed portion of the mold and surrounded by the projection portion 15, and the thin film portion 142 around the projection portion 15.

Then, the mold 20 and the release film 30 are released from the resin layer 14 to complete the light-emitting device 10 (see FIG. 17E).

According to an exemplary method for producing the light-emitting device of the present exemplary embodiment, the projection portion 15 can be brought into pressure contact with the mold 20 (release film 30) during the compression molding, and accordingly, the lens-shaped (hemispherical) convex portion 141 and the thin film portion 142 of the resin layer 14 can be separated from each other surely. Accordingly, the completed light-emitting device can be configured such that the light leakage from the convex portion 141 into the thin film portion 142 and the light emission from the thin film portion 142 due to the light leakage can be prevented to provide light emission with uniform color as a whole.

In the method for producing the light-emitting device, the projection portion 15 can be formed from a material of high rigidity with the same light shielding property as that of the substrate 11. Accordingly, the adhesion between the projection portion 15 with thinned thickness and the mold 20 can be enhanced while the completed light-emitting device can provide the high light shielding effect against the light from the side surface of the convex portion 141 of the resin layer 14.

FIGS. 17A to 17D illustrate a method for producing the light-emitting device 10 with a single LED element as shown in FIGS. 14A and 14B. However, the light-emitting device 100 with a plurality of LED elements as shown in FIGS. 16A and 16B can be produced in the same manner as in the case of the single LED element, except that the reflector with a plurality of openings corresponding to the number of the LED elements is prepared and the ring-shaped base materials corresponding to the number of the LED elements are stacked to form the projection portions 15.

The present exemplary embodiment is different from the method of the fourth exemplary embodiment at least in that the projection portion to be provided around the LED element can be formed form a white-filler containing resin. The different point from the production method of the fourth exemplary embodiment will be described with reference to FIGS. 18A to 18D.

Figure 18D:
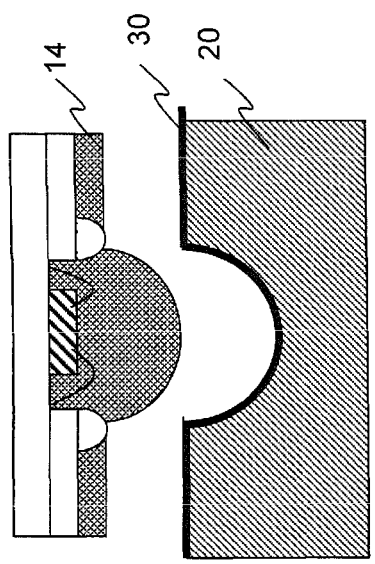
FIGS. 18A, 18B, 18C, 18D, and 18E are diagrams illustrating a fifth exemplary embodiment of a method for producing a light-emitting device of the presently disclosed subject matter.
Figure 18E:
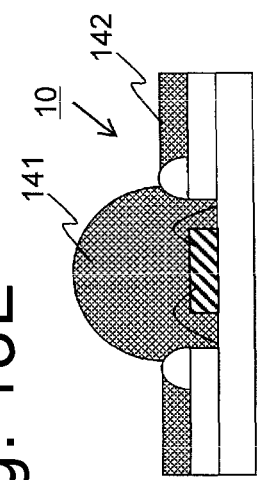
Figure 18A:
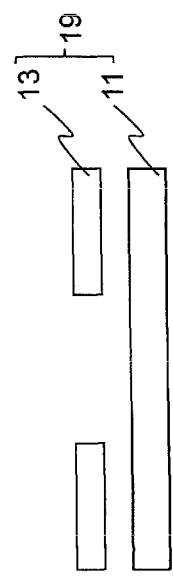
Figure 18B:
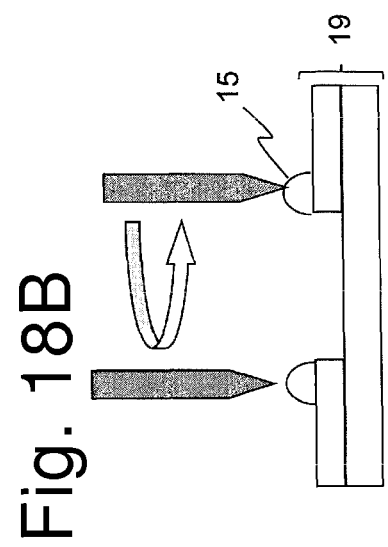
Figure 18C:
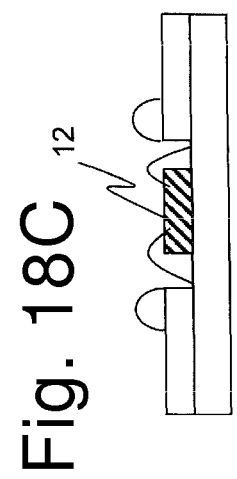
Figure 19A:
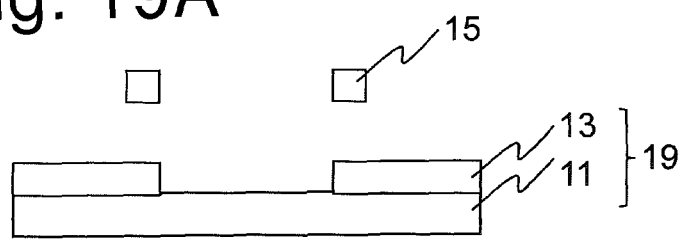
FIGS. 19A, 19B, 19C, and 19D are diagrams illustrating a sixth exemplary embodiment of a method for producing a light-emitting device of the presently disclosed subject matter.
Figure 19B:
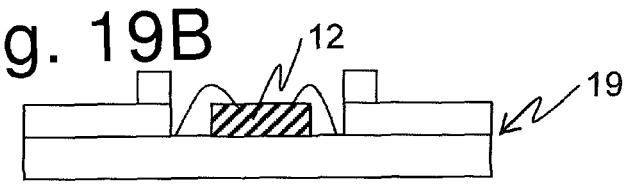
Figure 19C:
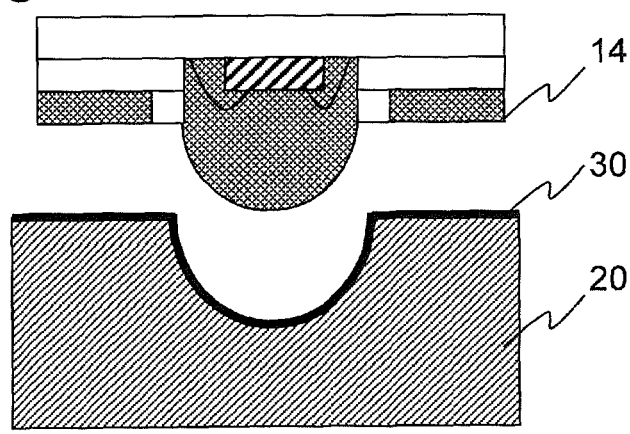
Figure 19D:
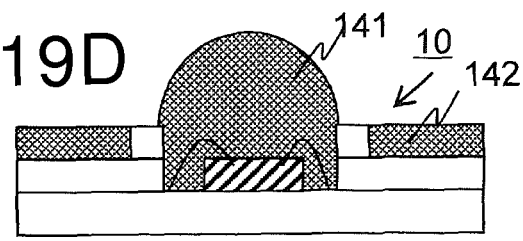

In the present exemplary embodiment, a reflector 13 (or a base material therefor) can be stacked on a package substrate 11 having a wiring pattern (not shown) to form a stacked substrate 19 (see FIG. 18A). Then, a white-filler containing resin is coated around the opening of the reflector 13 by dispensing method to form a dam member (projection portion) 15 (FIG. 18B). Examples of the dam member (projection portion) 15 here may include silicone resins, epoxy resins, and hybrid resins. In view of the appropriate elasticity and long-term reliability, a silicone resin is possible. Examples of the white filler may include fillers such as $TiO_2$, $Al_2O_3$, AlN, $SiO_2$, and ZnO, and the amount thereof in an exemplary embodiment can be 1 to 40 wt % with respect to the resin amount.

The size of the dam member may be a 0.2 mm or larger width and a 0.05 mm or higher height. After curing the dam member, an LED element 12 is mounted on the substrate 11 (see FIG. 18C). Then, the resin is filled and molded with the mold 20 by the compression molding to complete the light-emitting device, as in the fourth exemplary embodiment (FIGS. 18D and 18E). In the present exemplary embodiment, the projection portion 15 is formed from an elastic white-filler containing resin. Therefore, even when the thickness of the substrate 11 is varied largely, the flexibility of the dam member can absorb the variation of the substrate during the compression molding, thereby achieving the favorable adhesion with the mold. This configuration can prevent the resin from entering the upper end of the projection portion 15 to form a resin thin film thereon, thereby surely separating the lens-shaped convex portion 141 of the resin layer 14 and the surrounding thin film portion 142.

In the present exemplary embodiment, it is also possible to produce a light-emitting device with light emission of uniform color by preventing the light leakage from the convex portion 141 of the resin layer 14 into the thin film portion 142 and the light emission from the thin film portion 142 due to the light leakage. The use of elastic dam member can ensure the close contact with the mold to the relatively large area, thereby surely separating the convex portion 141 of the resin layer 14 and the thin film portion 142 during the compression molding as well as shielding light from the convex portion 141 of the resin layer 14 to the thin film portion 142 after the completion of the light-emitting device.

The present exemplary embodiment is different from the production method of the fourth or fifth exemplary embodiment at least in that the projection portion provided around the LED element is formed from a white reflective plate. FIGS. 19A, 19B, 19C, and 19D illustrate the method for producing a light-emitting device of the present exemplary embodiment, and FIGS. 20A and 20B a plan view and a side view illustrating a base material for a projection portion used in the production method.

Also in the present exemplary embodiment, as in the fifth exemplary embodiment, a reflector 13 is stacked on a package substrate 11 to form a stacked substrate 19. Then, a ring-shaped white reflective plate 150 which is shown in FIGS. 20A and 20B and has an opening corresponding to the reflector opening is used as the projection portion 15. This white reflective plate is adhered to the reflector 13 with an adhesive. The material of the white reflective plate may be the same as or different from the material of the substrate 11 and the reflector 13, and may be a ceramic plate, a white-filler containing resin plate, or the like. Examples of the adhesive may include an epoxy adhesive and a silicone adhesive. The thickness (width) of the ring portion of the ring-shaped white reflective plate may be 0.1 mm or larger and the height thereof may be 0.05 mm or larger. The diameter of the ring may be the same as that of the opening portion of the reflector 13, and the ring-shaped reflective plate can be adhered to the reflector so that the edge of the opening of the ring is overlapped with the reflector 13.

Then, the LED element 12 is mounted on the substrate 11 and the compression molding is performed to form the convex portion 141 of the resin layer 14 and the thin film portion 142 in the same manner as in the fourth and fifth exemplary embodiments.

According to the production method of the present exemplary embodiment, the same light-emitting device as in the fourth exemplary embodiment can be produced easier. In the fourth exemplary embodiment, when a ceramic plate is used to form a stacked substrate, a green sheet before firing should be processed in advance while taking the shrinkage of the sheet during firing into consideration. On the contrary, the present exemplary embodiment can employ a plate material processed in advance, and accordingly, the dimension stability can be ensured, and there is no need to process a sheet material with the dimensional variation due do shrinkage taken into consideration.

In the fifth and sixth exemplary embodiments, the light-emitting device is not only that provided with a single LED element as shown in FIGS. 14A and 14b but also that provided with a plurality of LED elements as shown in FIGS. 16A and 16B.

In the fourth to sixth exemplary embodiment, the forming of the light-shielding projection portion 15 is formed and then the LED element is mounted on the substrate. However, this is not limitative, and the LED element can be mounted before the projection portion 15 is formed.

Examples

In order to confirm the different and/or advantageous effects of the presently disclosed subject matter, the light-emitting devices with respective structures shown in FIGS. 21A to 21D were produced and the occurrence of the color unevenness was evaluated. FIG. 21A shows the same structure as that of the light-emitting device shown in FIG. 14A (Example 1), in which the substrate 11, reflector 13 and projection portion 15 were formed from a ceramic material and produced in accordance with the fourth exemplary embodiment of the production method. The thickness of the reflector 13 was 0.15 mm, and the width and the height (thickness) of the projection portion 15 were 0.1 mm and 0.05 mm, respectively. The light-emitting device shown in FIG. 21B (Comparative Example 1) was produced in the same manner as in the light-emitting device shown in FIG. 21A, except that the projection portion 15 was not provided to the light-emitting device. The light-emitting device shown in FIG. 21C (Comparative Example 2) was produced in a manner such that the reflector and the projection portion were not formed after the LED element was mounted on the substrate 11, and then the resin layer was formed by the compression molding. The light-emitting device shown in FIG. 21D (Comparative Example 3) was produced in a manner such that the light-emitting device shown in FIG. 21C was produced and then the thin film portion surrounding the convex portion was removed by sand-blasting.

In any of the light-emitting devices, the LED element was a phase-up type element (including a GaN type semiconductor layer formed on a transparent sapphire substrate, 0.3 mm (L)×0.5 mm (W)×0.12 mm (T)). The convex portions of the resin layer had a height of 0.85 mm and a diameter of 1.5 mm for Example 1 and Comparative Example 1, or a height of 0.75 mm and a diameter of 1.5 mm for Comparative Examples 2 and 3.

The LED element of each of the light-emitting devices of Example and Comparative Examples was supplied with power, and the color of the light emission was observed from above the device. Evaluation criteria was as follows:

A: almost no color unevenness was observed.

C: Surrounding yellowish light and/or bluish light directly above the element was clearly observed.

The results are shown in Table 2.

TABLE 2

|  | Example 1 | Comparative Example 1 | Comparative Example 2 | Comparative Example 3 |
| --- | --- | --- | --- | --- |
| Structure | PP: Present<br>R: Present | PP: None<br>R: Present | PP: None<br>R: None | PP: None<br>TFRP: None |
| Yield | A | A | A | C |
| Evaluation on Color Unevenness | A | C | C | A |
| Misc. | Rectangular bluish area and surrounding yellowish area were not observed. | Surrounding yellowish area was still observed. | Rectangular bluish area and surrounding yellowish area were observed. | Although surrounding yellowish area was suppressed, there were several defects such as a lens peeling-off due to resin peeling-off. |

PP: Projection portion
R: Reflector
TFRP: Thin film resin portion

As seen from the results in Table 2, the light-emitting devices of Example 1 made in accordance with the principles of the presently disclosed subject matter could provide light emission with uniform color while the color unevenness was surely suppressed. In the light-emitting device of Comparative Example 3, the color unevenness was improved as in Example due to the removal of the thin film resin layer, but the convex portion of the resin layer was partly peeled off during the resin removal.

According to an aspect of certain embodiments of the presently disclosed subject matter, there is provided a light-emitting device with improved yield and without color unevenness of light emission.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light-emitting device comprising:
   a substrate;
   at least one LED element mounted on the substrate;
   a resin layer including a wavelength conversion material and located on the substrate to cover the at least one LED element, the resin layer further including a convex portion directly covering the at least one LED element and a flat thin film portion extending around the convex portion;
   a reflective portion located over the thin film portion around the convex portion; and
   a diffusion portion covering the convex portion of the resin layer, wherein
   the reflective portion is a tubular member surrounding an outer periphery of the convex portion with a certain distance between the reflective portion and the outer periphery of the convex portion, and the diffusion portion is formed within a space surrounded by the tubular member so as to cover the convex portion.

2. A light-emitting device comprising:
   a substrate;
   a plurality of LED elements mounted on the substrate in an array;
   a resin layer including a wavelength conversion material and located on the substrate to cover the plurality of LED elements;
   a reflective portion located over an area of the resin layer between the plurality of LED elements; and
   a diffusion portion, and the resin layer including convex portions corresponding to the plurality of LED elements, wherein the diffusion portion is formed to cover the convex portions of the resin layer, and wherein
   the reflective portion is a tubular member surrounding an outer periphery of the convex portion with a certain distance between the reflective portion and the outer periphery of the convex portion, and the diffusion portion is formed within a space surrounded by the tubular member so as to cover the convex portion.

3. The light-emitting device according to claim 1, wherein the diffusion portion is formed over the thin film portion of the resin layer, and the reflective portion is formed over the thin film portion of the resin layer with the diffusion portion interposed therebetween.

4. The light-emitting device according to claim 2, wherein the resin layer includes a thin film portion extending around the convex portion, and the diffusion portion is formed over the thin film portion of the resin layer, and the reflective portion is formed over the thin film portion of the resin layer with the diffusion portion interposed therebetween.

5. The light-emitting device according to claim 1, wherein the reflective portion is formed from a white resin.

6. The light-emitting device according to claim 2, wherein the reflective portion is formed from a white resin.

7. The light-emitting device according to claim 1, wherein the reflective portion is formed from a white resin.

8. The light emitting device according to claim 1, wherein the reflective portion is a thin film stacked on the resin layer.

9. The light emitting device according to claim 2, wherein the reflective portion is a thin film stacked on the resin layer.

10. A light-emitting device comprising:
    a substrate;
    at least one LED element mounted on the substrate;
    a reflector adjacent the LED element;
    a resin layer including a convex portion covering the at least one LED element and a thin film portion covering the reflector; and
    a light-shielding projection portion located on the reflector and separating the convex portion and the thin film portion of the resin layer while the resin layer is not formed on the projection portion.

* * * * *